(12) United States Patent
Yamada et al.

(10) Patent No.: US 7,749,622 B2
(45) Date of Patent: Jul. 6, 2010

(54) MULTILAYER FILM-COATED SUBSTRATE AND PROCESS FOR ITS PRODUCTION

(75) Inventors: Tomohiro Yamada, Yokohama (JP); Eiji Shidoji, Yokohama (JP); Akira Mitsui, Yokohama (JP); Takuji Oyama, Yokohama (JP); Toshihisa Kamiyama, Takasago (JP)

(73) Assignee: Asahi Glass Company, Limited, Tokyo (JP)

( * ) Notice: Subject to any disclaimer, the term of this patent is extended or adjusted under 35 U.S.C. 154(b) by 257 days.

(21) Appl. No.: 11/110,849

(22) Filed: Apr. 21, 2005

(65) Prior Publication Data

US 2005/0205998 A1 Sep. 22, 2005

Related U.S. Application Data

(63) Continuation of application No. PCT/JP03/13481, filed on Oct. 22, 2003.

(30) Foreign Application Priority Data

Oct. 22, 2002 (JP) ............................. 2002-306705

(51) Int. Cl.

| G11B 11/105 | (2006.01) |
| C09J 7/02 | (2006.01) |
| B32B 9/00 | (2006.01) |
| B32B 19/00 | (2006.01) |
| F21V 9/04 | (2006.01) |
| G02B 1/10 | (2006.01) |
| G02B 27/14 | (2006.01) |

(52) U.S. Cl. ...................... 428/702; 359/359; 359/580; 359/588; 359/634; 428/332; 428/337; 428/701; 428/432

(58) Field of Classification Search ................. 359/359, 359/580, 588, 634; 428/332, 337, 701, 702

See application file for complete search history.

(56) References Cited

U.S. PATENT DOCUMENTS 3,247,392 A * 4/1966 Thelen ........................ 250/226
5,154,810 A 10/1992 Kamerling et al.

(Continued)

FOREIGN PATENT DOCUMENTS

EP 369254 5/1990

(Continued)

*Primary Examiner*—Timothy M Speer
*Assistant Examiner*—Jonathan C Langman
(74) *Attorney, Agent, or Firm*—Oblon, Spivak, McClelland, Maier & Neustadt, L.L.P.

(57) ABSTRACT

A multilayer film-coated substrate having the stress of the film relaxed by depositing a multilayer film comprising a metal oxide film and a silicon oxide film on a substrate at a high speed by a sputtering method using a conductive sputtering material, and a process for producing a multilayer film-coated substrate having such a low stress, are presented.

A multilayer film-coated substrate comprising a substrate and at least a metal oxide film and a silicon oxide film laminated thereon repeatedly at least once, wherein at least one layer of said metal oxide film is a metal oxide film deposited by sputtering by using, as the target material, a metal oxide $MO_X$ which is deficient in oxygen than the stoichiometric composition, to have the oxygen deficiency resolved, and the stress of the multilayer film is from −100 MPa to +100 MPa.

26 Claims, 2 Drawing Sheets

◆ $Nb_2O_5$ single layer film deposited from $NbO_X$ target material (oxygen content: 10 vol%)

▲ $Nb_2O_5$ single layer film deposited from Nb target material (oxygen content: 30 vol%)

U.S. PATENT DOCUMENTS

| | | |
|---|---|---|
| 5,241,417 A | 8/1993 | Sekiguchi |
| 5,646,781 A * | 7/1997 | Johnson, Jr. ................ 359/589 |
| 6,134,049 A | 10/2000 | Spiller et al. |
| 6,193,856 B1 * | 2/2001 | Kida et al. ............. 204/192.22 |
| 6,338,777 B1 | 1/2002 | Longstreth White |
| 6,863,785 B2 | 3/2005 | Shidoji et al. |
| 2002/0027817 A1 | 3/2002 | Kida et al. |

FOREIGN PATENT DOCUMENTS

| | | |
|---|---|---|
| EP | 1 046 727 | 10/2000 |
| JP | 49-115085 | 11/1974 |
| JP | 3-253568 | 11/1991 |
| JP | 4-173971 | 6/1992 |
| JP | 5-21347 | 1/1993 |
| JP | 5-222530 | 8/1993 |
| JP | 5-222531 | 8/1993 |
| JP | 6-207269 | 7/1994 |
| JP | 6-212421 | 8/1994 |
| JP | 7-109569 | 4/1995 |
| JP | 8-325725 | 12/1996 |
| JP | 10-330934 | 12/1998 |
| JP | 11-241162 | 9/1999 |
| JP | 2001-3166 | 1/2001 |
| JP | 2002-277629 | 9/2002 |
| WO | WO 97/08359 | 3/1997 |
| WO | WO 02/075376 A1 | 9/2002 |

* cited by examiner

◆ Nb₂O₅ single layer film deposited from NbOx target material (oxygen content: 10 vol%)

▲ Nb₂O₅ single layer film deposited from Nb target material (oxygen content: 30 vol%)

MULTILAYER FILM-COATED SUBSTRATE AND PROCESS FOR ITS PRODUCTION

TECHNICAL FIELD

The present invention relates to a single layer film of a metal oxide film having the stress of the film relaxed by sputtering, a multilayer film-coated substrate comprising a metal oxide film and a silicon oxide film, and a process for producing such a film-coated substrate.

BACKGROUND ART

Optical applications of thin metal oxide films start from a single layer heat reflecting glass or an anti-reflecting film and further extend to various fields including, for example, an anti-reflecting coating, a reflection-increasing coating, an interference filter and a polarizing film, of a multilayer film type designed so that a light having a specific wavelength is selectively reflected or transparent. The spectral characteristics of a multilayer film are optically designed by using refractive indices n and thicknesses of the respective layers, as parameters and usually adjusted by a combination of a high refractive index film and a low refractive index film. To realize excellent optical characteristics, it is better that the difference in the refractive index n is large between the high refractive index film and the low refractive index film. For example, a combination of titanium dioxide with n=2.4, niobium pentoxide with n=2.3, tantalum pentoxide with n=2.1 or tungsten trioxide with n=2.0, with magnesium fluoride with n=1.38 or silicon oxide with n=1.46, is preferred. Such a single layer or multilayer film can be deposited, for example, by a vacuum evaporation method or a wet coating method.

On the other hand, in a case where a single layer or multilayer film is deposited on a substrate having a large area, such as glass for buildings, glass for automobiles, CRT or a flat display, a sputtering method, particularly, a DC sputtering method, is used in many cases.

In a case where a high refractive index film is deposited by a DC sputtering method, it is presently common to employ so-called reactive sputtering, wherein sputtering is carried out in an atmosphere containing oxygen, but using a metallic target having electrical conductivity. However, the deposition rate for a thin film obtained by this method is extremely slow, and there has been a problem that the productivity is poor, and the cost tends to be high.

In order to avoid such a problem, it is conceivable to put a high sputtering electric power. However, in a case where cooling of the target material cannot catch up, the possibility for a trouble such as cracking or peeling tends to be high, whereby the power which can be put, has been limited. In addition, the stress of the metal oxide film thereby obtained, is high which used to cause bow of the film-coated substrate. Especially when a multilayer film having a metal oxide film and a silicon oxide film alternately laminated in many layers, is formed on a thin substrates the bow tended to increase as the total film thickness increased. Accordingly, such a measure has been taken that bow is prevented by depositing the film on a substrate thicker than the finally required film thickness, then slits of desired sizes are imparted from the film side to release the stress, whereupon the substrate is polished to the necessary thickness, and thereafter, the substrate is cut into a desired size.

Further, a method has also been proposed wherein a transparent metal oxide film having a high refractive index is deposited on a transparent substrate by carrying out DC sputtering by using, as the target material, a metal oxide $MO_X$ (wherein M is at least one metal selected from the group consisting of Ti, Nb, Ta, Mo, W, Zr and Hf) which is deficient in oxygen than the stoichiometric composition (e.g. WO (republished) 97/08359). However, this publication discloses nothing about the bow or stress of the film.

It is an object of the present invention to provide a multilayer film-coated substrate having the stress of the film relaxed i.e. having a low stress, by depositing a multilayer film comprising a metal oxide film and a silicon oxide film on a substrate at a high speed by a sputtering method using a conductive sputtering material, and a process for producing a multilayer film-coated substrate having such a low stress. In order to obtain a film-coated substrate with little bow of the substrate, the stress of the multilayer film having a metal oxide film and a silicon oxide film laminated, is required to be from −100 MPa to +100 MPa, preferably from −70 MPa to +70 MPa, particularly preferably from −60 MPa to +60 MPa, most preferably from −30 MPa to +30 MPa. Here, when the stress is on the (+) side, it is a tensile stress, and when it is on the (−) side, it is a compressive stress.

DISCLOSURE OF THE INVENTION

The present invention provides a multilayer film-coated substrate comprising a substrate and at least a metal oxide film and a silicon oxide film laminated thereon repeatedly at least once, wherein at least one layer of said metal oxide film is a metal oxide film deposited by sputtering by using, as the target material, a metal oxide $MO_X$ (where M is at least one metal selected from the group consisting of Ti, Nb, Ta, Mo, W, Zr and Hf) which is deficient in oxygen than the stoichiometric composition, to have the oxygen deficiency resolved, and the stress of the multilayer film is from −100 MPa to +100 MPa.

The multilayer film-coated substrate of the present invention is preferably such that when metal M in the metal oxide $MO_X$ is Nb and/or Ta, X is 2<X<2.5.

Further, the multilayer film-coated substrate of the present invention is preferably such that when metal M in the metal oxide $MO_X$ is at least one metal selected from the group consisting of Ti, Zr and Hf, X is 1<X<2.

Further, the multilayer film-coated substrate of the present invention is preferably such that when metal M in the metal oxide $MO_X$ is Mo and/or W, X is 2<X<3.

Further, the multilayer film-coated substrate of the present invention is preferably such that the stress of the multilayer film is from −60 MPa to +60 MPa.

Further, the multilayer film-coated substrate of the present invention is preferably such that the metal oxide film and the silicon oxide film are laminated repeatedly at least 10 times.

The multilayer film-coated substrate of the present invention is preferably such that the thickness of the substrate is from 0.05 to 0.4 mm, and the bow of the substrate after depositing the multilayer film is from −20 to +20 μm.

Further, the multilayer film-coated substrate of the present invention is preferably such that the thickness of the substrate is from 0.5 to 2 mm, and the bow of the substrate after depositing the multilayer film is from −100 to +100 μm.

The multilayer film-coated substrate of the present invention is preferably such that the area for forming the multilayer film is from 1 to 900 cm².

The multilayer film-coated substrate of the present invention is preferably such that the thickness of one layer of the metal oxide film is from 10 nm to 10 μm, and the thickness of one layer of the silicon oxide film is from 10 nm to 10 μm.

The multilayer film-coated substrate of the present invention is preferably such that the total thickness of the multilayer film is from 20 nm to 2000 µm.

The multilayer film-coated substrate of the present invention is preferably such that the total thickness of the multilayer film is from 20 to 5000 nm, and the absolute value of the difference in bow of the substrate as between before and after depositing the film is at most 25 µm.

The multilayer film-coated substrate of the present invention is preferably such that the value obtained by dividing the absolute value of the difference in bow of the substrate as between before and after depositing the film by the film thickness, is at most 10.

The multilayer film-coated substrate of the present invention is preferably such that the multilayer-coated substrate is a dichroic mirror, an ultraviolet filter, an infrared filter, a band pass filter or a gain-flattening filter.

The present invention provides a process for producing a multilayer film-coated substrate having at least a metal oxide film and a silicon oxide film alternately laminated on a substrate, wherein at least one layer of said metal oxide film is a metal oxide film deposited by sputtering by using, as the target material, a metal oxide $MO_X$ (where M is at least one metal selected from the group consisting of Ti, Nb, Ta, Mo, W, Zr and Hf) which is deficient in oxygen than the stoichiometric composition, to have the oxygen deficiency resolved, and the stress of the multilayer film is from −100 MPa to +100 MPa.

DESCRIPTION OF SYMBOLS

Figure 1:
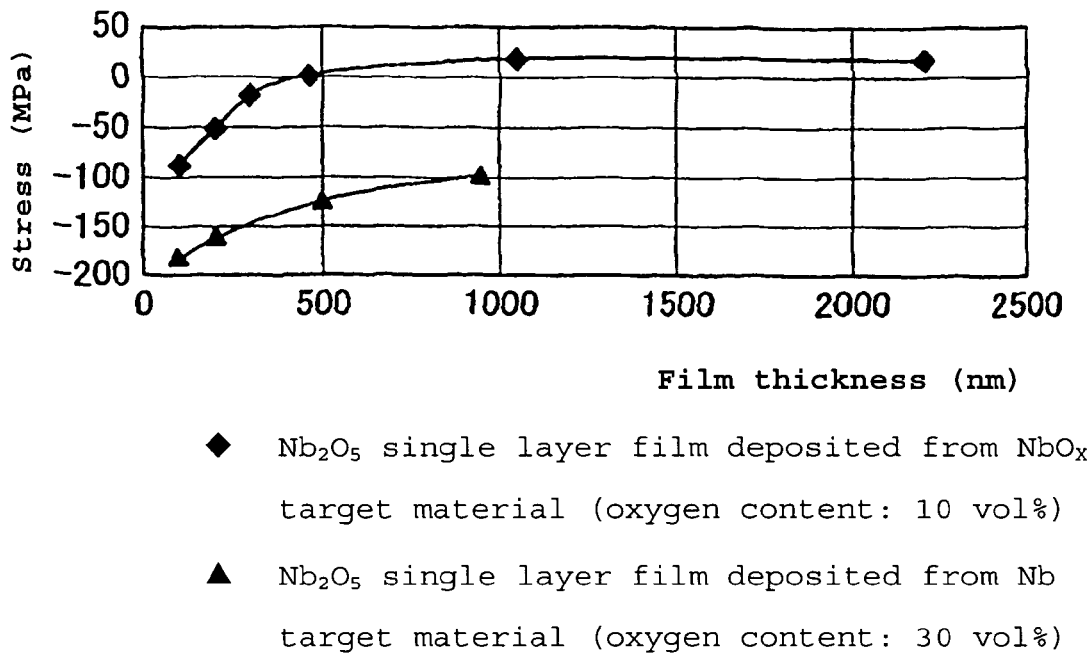
FIG. 1 is a graph showing the relation between the film thickness of a $Nb_2O_5$ single layer film formed by a DC sputtering method and the stress of the film.

S: Ideal substrate
S': Real substrate
R: Radius of curvature
r: Radius of the substrate
δ: Bow of the substrate
10: Substrate
20: Metal oxide film
30: Silicon oxide film
40: Multilayer film
50: Interlayer

BEST MODE FOR CARRYING OUT THE INVENTION

The multilayer film-coated substrate of the present invention is produced by a process wherein sputtering is carried out by using, as a target material, a metal oxide $MO_X$ which is deficient in oxygen than the stoichiometric composition, to deposit a metal oxide film having the oxygen deficiency resolved, on a substrate.

In the present invention, the target material to be used to obtain the metal oxide film is a metal oxide, and it is a metal oxide $MO_X$ (where M is at least one metal selected from the group consisting of Ti, Nb, Ta, Mo, W, Zr and Hf) which is deficient in oxygen than the stoichiometric composition and may contain two or more metals M.

When M is Nb and/or Ta, X is preferably $2<X<2.5$. The reason is that when X is 2.5, Nb and/or Ta is in a completely oxidized state, whereby the target material is electrically insulating, and DC sputtering cannot be carried out. On the other hand, when X is less than 2, $NbO_X$ and/or $TaO_X$ is chemically instable, and such is not desirable as a target material. In a case where $NbO_X$ is used, a high deposition rate can be realized, and when $TaO_X$ is used, it is possible to deposit a film having high corrosion resistance and high scratch resistance.

For the same reason as mentioned above, when M in $MO_X$ of the target material of the present invention is Mo and/or W, X is preferably $2<X<3$.

Further, when M in $MO_X$ of the target material of the present invention is at least one metal selected from the group consisting of Ti, Zr and Hf, X is preferably $1<X<2$.

To the target material to be used to obtain a metal oxide film in the present invention, an oxide of metal other than metal M constituting the metal oxide $MO_X$ may be added to improve the performance of the film such as the refractive index or the mechanical or chemical characteristics, unless the characteristics including relaxing of the stress of the film by $MO_X$, are not impaired. As such a metal oxide, an oxide of at least one metal selected from the group consisting of Cr, Ce, Y, Si, Al and B, may be mentioned. Such an metal oxide is not required to be an oxygen deficient type. For example, in the case of an oxide of Cr, the corrosion resistance of the film can be improved, and in the case of an oxide of Ce, it is possible to impart an ultraviolet blocking property to the metal oxide film.

The production method of the target material to be used to obtain the metal oxide film in the present invention, is not particularly limited. For example, in the case of $NbO_X$ (where $2<X<2.5$), it may be produced as follows. In the case of other metal oxides, the method is not essentially different.

A $Nb_2O_5$ powder is hot-pressed (by high temperature high pressure pressing) in a non-oxidizing atmosphere and sintered to produce $NbO_X$ (where $2<X<2.5$) which is deficient in oxygen (oxygen deficient) than the stoichiometric composition. The particle size of the $Nb_2O_5$ powder is suitably from 0.05 to 40 µm. It is important that the atmosphere for hot pressing is a non-oxidizing atmosphere, and argon or nitrogen is preferred, since it is thereby easy to adjust the oxygen content in the target material. Further, hydrogen may be added. The conditions for hot pressing are not particularly limited, but the temperature is preferably from 800 to 1400° C., and the pressure is preferably from $4.90 \times 10^6$ to $9.80 \times 10^6$ Pa.

The density of the $NbO_X$ sintered body is from about 4.0 to 4.6 g/cm³, and the resistivity is from about 1 to 10 Ωcm.

Further, the density of a $TiO_X$ sintered body is from about 3.8 to 4.2 g/cm³, and the resistivity is from about 0.1 to 0.6 Ωcm.

Otherwise, it is also possible to obtain a target material to be used in the present invention, which is made of a metal oxide deficient in oxygen than the stoichiometric composition, by applying an undercoating of a metal or an alloy and forming a metal oxide by plasma spraying such that while a metal oxide is made in a semi molten state on the undercoating in a high temperature plasma gas in a reducing atmosphere, the semi molten product is transported onto the undercoating by this gas and deposited.

In the present invention, the substrate on which the metal oxide film is deposited, may, for example, be a glass, a resin film or silicon and is not particularly limited. However, it is preferred to use a glass, from the viewpoint of the transparency. Usually, when a multilayer film is formed on a thin substrate, there has been a tendency such that the bow increases as the total film thickness increases. Accordingly, it has been common to take a measure such that bow is prevented by depositing a film on a substrate thicker than the finally required thickness, then, slits of desired sizes are imparted from the film side to release the stress, whereupon the substrate is polished to the necessary thickness, and thereafter, the substrate is cut into a desired size. However, the multilayer film of the present invention has a small stress, whereby substantial bow which used to be formed at the time of deposition, will not be formed, whereby it is not necessary to polish the substrate, and a multilayer film may be formed on a thin substrate as it is.

In the case of a multilayer film-coated substrate for so-called non-communication purpose, such as a dichroic mirror to be used for a liquid crystal projector or an infrared blocking filter to be used for a digital camera, the thickness of the final substrate is preferably from 0.05 to 0.4 mm with a view to reducing the weight or thickness of a product in which the multilayer film-coated substrate is used. Further, the degree of bow of the substrate after forming the multilayer film is preferably from −20 to +20 μm, more preferably from −5 to +5 μm, although it may vary depending also on the particular purpose. Here, the bow of the substrate is calculated by the method described hereinafter. An example is shown in FIG. 2.

Figure 2:
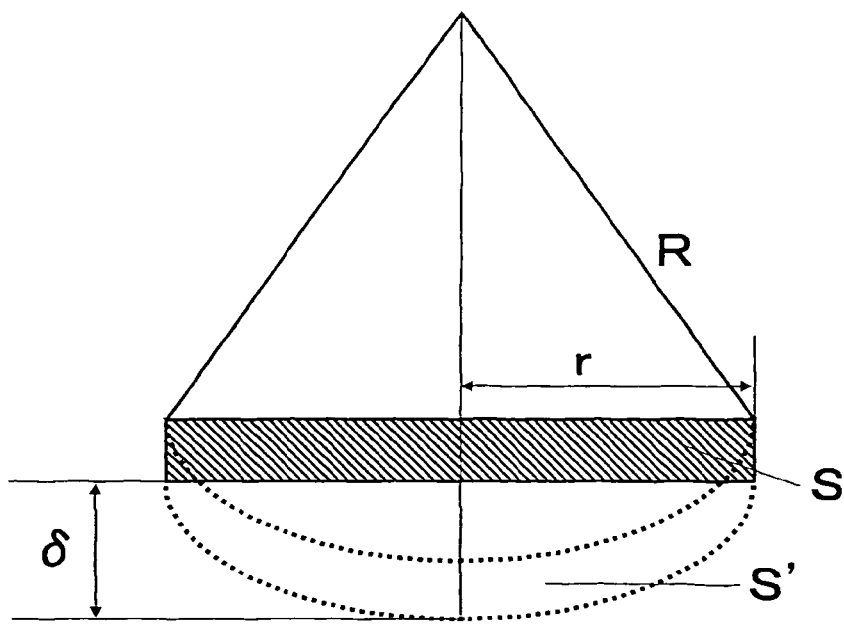
FIG. 2 is a schematic cross-sectional view of a multilayer film-coated substrate to illustrate a bow δ of a substrate.

FIG. 2 is a schematic cross-sectional view of a multilayer film-coated substrate for calculation of the bow of a substrate. In FIG. 2, the substrate S means an ideal substrate having no bow, and the substrate S' means an actual substrate having a bow. Here, the bow of the substrate means the distance δ from the surface of the substrate S having a radius r on which a film is to be formed, to the largest concave or convex of the substrate S'. Here, the symbol for the bow is (+) when the film-formed side is convex, and (−) when the film-formed side is concave.

On the other hand, in the case of a multilayer film-coated substrate for so-called optical communication purpose, such as a band pass filter or a gain flattening filter, the thickness of the final substrate is from 0.5 to 2 mm in many cases. Further, the degree of the bow of the substrate after forming the multilayer film is preferably from −100 to +100 μm, more preferably from −50 to +50 μm in the state before cutting, although it may vary depending also on the particular purpose.

Further, the larger the area of the substrate (the area of the surface on which the multilayer film is formed), the larger the bow of the substrate. For the necessity to limit the bow of the substrate within an allowable range, the area of the substrate is preferably from 0.01 to 900 $cm^2$, particularly preferably from 1 to 900 $cm^2$, further preferably from 4 to 900 $cm^2$, for both the non-communication purpose and the optical communication purpose.

Further, the area of a substrate as the final product to be used for an application for either the non communication purpose or the optical communication purpose, is larger than 0.01 $cm^2$ and smaller than 900 $cm^2$, for example, at most 100 $cm^2$, at most 50 $cm^2$, at most 10 $cm^2$ or at most 1 $cm^2$, in many cases. However, in the present invention, it is possible to deposit a film on a substrate having a large area as mentioned above, and then the substrate is cut into a desired size to obtain a final product, whereby a multilayer film-coated substrate can be obtained while reducing the cost.

Further, from the necessity to limit the bow of the substrate within an allowable range, the absolute value of the difference in bow of the substrate as between before and after the deposition, is preferably at most 25 μm when the total thickness of the multilayer film is from 20 to 5,000 nm, and it is preferably at most 15 μm when the total thickness of the multilayer film is from 20 to 2,500 nm, and at most 5 μm when the total thickness of the multilayer film is from 20 to 500 nm. Further, the absolute value of the difference in bow of the substrate as between before and after the deposition tends to be large as the film thickness increases, and accordingly, in many cases, the film quality is evaluated by the value obtained by dividing the absolute value of the difference in bow of the substrate as between before and after the deposition, by the film thickness (i.e. the absolute value of the difference in bow of the substrate as between before and after the deposition/the film thickness). The value obtained by dividing the absolute value of the difference in bow of the substrate as between before and after the deposition, by the film thickness, is preferably at most 10, particularly preferably at most 5, from the necessity to limit the bow of the substrate within a preferred range.

The substrate of the present invention provided with a multilayer film including a metal oxide film, having the stress of the film relaxed, can be produced, for example, by the following process, but the production process is not limited thereto. Cross-sectional schematic views of the multilayer film-coated substrates thereby formed, are shown in FIGS. 3 and 4.

Figure 3:
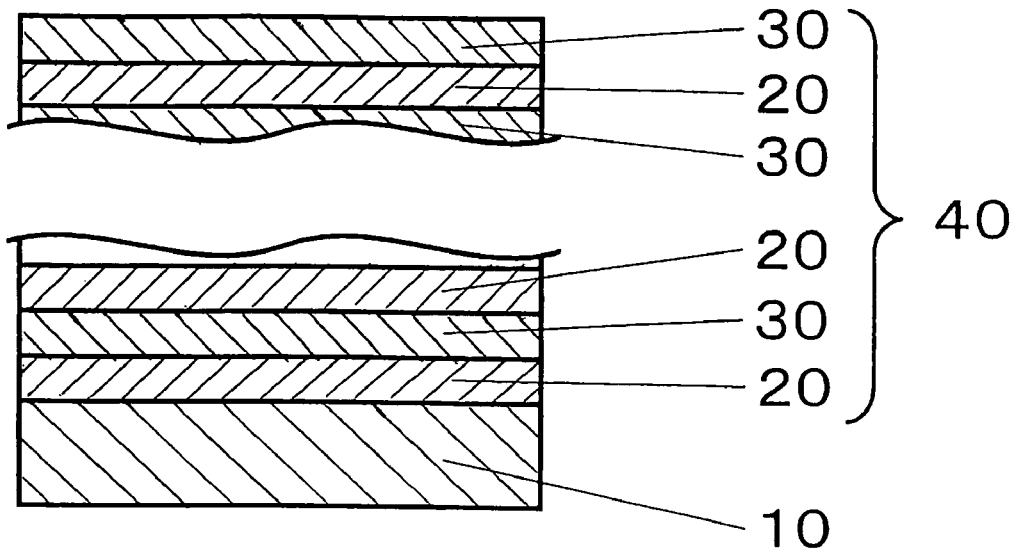
FIG. 3 is a cross-sectional schematic view of a multilayer film-coated substrate in the present invention.
Figure 4:
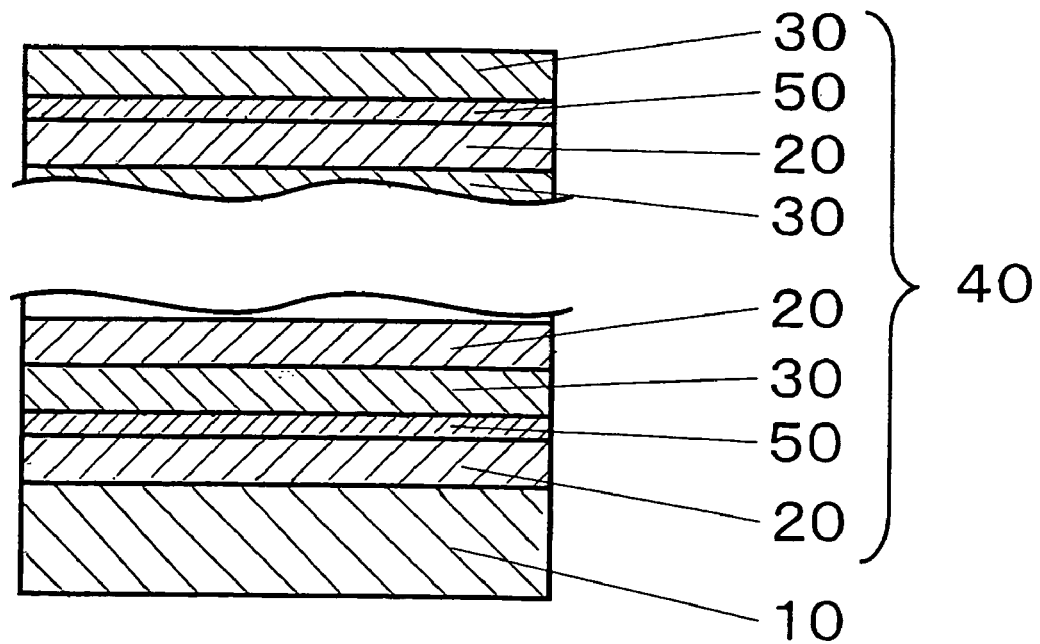
FIG. 4 is a cross-sectional schematic view of a multilayer film-coated substrate in the present invention.

FIG. 3 is a cross-sectional schematic view of a multilayer film-coated substrate of the present invention, wherein a metal oxide film 20 and a silicon oxide film 30 are laminated on a substrate 10 to form a multilayer film 40.

In the present invention, the target material to be used to obtain a metal oxide film is composed of a metal oxide and in such a state that oxygen is slightly deficient than the stoichiometric composition.

Accordingly, when the metal oxide film is deposited, the oxygen slightly deficient than the stoichiometric composition is supplemented from the sputtering atmosphere, and it is possible to obtain a metal oxide film having the oxygen deficiency resolved.

For example, when DC sputtering is carried out in an argon atmosphere or in an atmosphere of a mixture of argon with a small amount of oxygen under a pressure of from about 0.15 to 1.5 Pa by using, as a target material, a metal oxide in such a state that oxygen is slightly deficient than the stoichiometric composition, it is possible to deposit a uniform transparent film i.e. a metal oxide film having the oxygen deficiency resolved, on the substrate at a high speed. In a case where a metal target is used, a hysteresis phenomenon i.e. a non-continuous change in the deposition rate or in the discharge current or voltage is likely to take place due to a change in the oxygen partial pressure, but in a case where the metal oxide is used as a target material, no such hysteresis phenomenon will take place, whereby control of the deposition rate during the deposition is relatively easy, and yet, it is possible to reduce the amount of the oxygen gas to be supplied to the minimum level or to a level close thereto.

If the proportion of oxygen becomes small, the metal oxide film becomes close to a metal film and tends to be an absorbing film. Inversely, if the proportion of oxygen increases, the deposition rate decreases, and the stress of the metal oxide film tends to be a large compressive stress. Accordingly, it is important to adjust the partial pressure of oxygen, and it is preferred that oxygen is contained in an amount of from 0 to 30 vol % in the sputtering gas. However, in the case of a target material employing $NbO_X$, it is preferred that oxygen is contained in an amount of from 1 to 30 vol % in the sputtering gas. Further, in a case where a metal target material is used, it is preferred that oxygen is contained in an amount of at least 30 vol % in the sputtering gas so that the formed film will not be an absorbing film, although such may depends also on the applied electric power.

The thickness of the metal oxide film to be deposited may be adjusted by e.g. the sputtering time or the applied electric power, and the thickness of one layer of a metal oxide film is preferably from 10 nm to 10 μm, particularly preferably from 10 to 300 nm.

The metal oxide film to be deposited from a metal oxide target which is deficient in oxygen, is a film having the stress relaxed in spite of the fact that as compared with a metal oxide film deposited from a usual metal target, the optical characteristics such as the refractive index, are equal. The reason is not clearly understood, but it is considered attributable to the difference in the film growing process during the deposition.

Then, on the film-coated substrate having the above-mentioned metal oxide film deposited, sputtering is further carried out by using silicon as a target material, in the same manner as in the case where the above-mentioned metal oxide is used as the target material, to deposit a transparent silicon oxide film. The outermost layer may be either a metal oxide film or a silicon oxide film. Likewise, the innermost layer may be either a metal oxide film or a silicon oxide film. Further, in order to let the multilayer film satisfy various characteristics, as shown by the multilayer film-coated substrate in FIG. 4, an interlayer 50 different from the metal oxide film or the silicon oxide film may be incorporated in addition thereto. For example, in order to satisfy the optical conditions, an aluminum oxide film having an intermediate refractive index may be incorporated.

The metal oxide film and the silicon oxide film may be laminated repeatedly at least once and at most a plurality of times, such as at most five times, at most ten times or at most 50 times, and a multilayer film of more than 100 layers and not more than 1,000 layers, may be deposited. Accordingly, the thickness of the multilayer film becomes thick as the number of layers increases. However, the stress of the metal oxide film cancels out the stress of the silicon oxide film to some extent, and accordingly, even in the form of a multilayer film, the bow is very little. This means that in the production of a multilayer film, it is not necessary to increase the thickness of the substrate in order to prevent the bow, which substantially contributes to omission or reduction of the polishing step for a multilayer film-coated substrate after the deposition, to an increase of the number of layers in the multilayer film and to a reduction of the costs. The thickness of one layer of the metal oxide film in the multilayer film-coated substrate is preferably from 10 nm to 10 μm, particularly preferably from 10 to 300 nm, and the thickness of one layer of the silicon oxide film is preferably from 10 nm to 10 μm, particularly preferably from 10 to 300 nm. Further, the total thickness of the multilayer film is preferably from 20 nm to 2,000 μm, and particularly when used for the optical communication purpose, the total thickness is preferably from 20 to 2,000 μm, particularly preferably from 20 to 200 μm.

In the foregoing, a case has been described in which a metal oxide film is firstly deposited on the substrate and then a silicon oxide film is deposited to have a layer structure so that the silicon oxide film will be the outermost layer. However, also in a case where a silicon oxide film is firstly deposited on the substrate and then a metal oxide film is deposited, there will be no change in depositing the respective layers, and therefore, the description of such a case will be omitted. Further, for example, a three layer film comprising a metal oxide film, a silicon oxide film and a metal oxide film, or a five layer film having a silicon oxide film and a metal oxide film further laminated on such a three layer film, will be included, for the convenience sake, in the multilayer film-coated substrate of the present invention having the films laminated repeatedly at least once.

The multilayer film-coated substrate including the metal oxide film thus obtained can be used for various applications. Specifically, an application for non-communication purpose, such as a dichroic mirror, an ultraviolet blocking filter or an infrared blocking filter, or an application for optical communication purpose, such as a band pass filter or a gain flattening filter, may, for example, be mentioned.

In the foregoing, deposition for a multilayer film-coated substrate by DC sputtering has been described. However, also in the case of deposition for a multilayer film-coated substrate by alternate current (AC) sputtering, the deposition may be carried out in the same manner. By using the AC sputtering method, there will be a merit in that a film having a surface roughness smaller as compared with the DC sputtering method, may be obtained.

EXAMPLES

Now, the present invention will be described in further detail with reference to Examples. However, it should be understood that the present invention is by no means restricted to such Examples.

Preparation Example 1

$NbO_X$ Sintered Body

A commercially available high purity $Nb_2O_5$ powder was filled into a hot press mold made of carbon and maintained at 1,300° C. for 3 hours in an argon atmosphere and then hot-pressed under a pressure of 9.8 MPa to obtain a sintered body. The density and the resistivity of the sintered body were measured.

Then, the sintered body was pulverized in an agate mortar and heated at 1,100° C. in air, whereby the mass of the sintered body was measured before and after the heating. On the assumption that by this heating, $NbO_X$ in such a state that oxygen was deficient by the previous sintering, was changed to completely oxidized sintered body $Nb_2O_5$, the oxygen content of the sintered body was calculated from the increase of the mass to determine the oxygen deficiency. The sintered body had a density of 4.5 g/cm$^3$, a resistivity of 8.9 Ωcm and an oxygen content of 2.498 as X in $NbO_X$.

Preparation Example 2

$TiO_X$ Sintered Body

A sintered body was obtained in the same manner and conditions as in Preparation Example 1 except that a commercially available high purity $TiO_2$ powder was used instead of the highly pure $Nb_2O_5$ powder in Preparation Example 1, and the density and the resistivity of the sintered body were measured.

Then, the sintered body was heated in the same manner under the same conditions as in Preparation Example 1, and the mass of the sintered body was measured before and after the heating, whereupon the oxygen content of the sintered body was calculated from the increase in the mass to confirm the oxygen deficiency. The sintered body had a density of 3.90 g/cm$^3$, a resistivity of 0.35 Ωcm and an oxygen content of 1.980 as X in $TiO_X$.

(1) Formation of a Single Layer Film

Reference Examples 1 to 6

The NbO$_X$ sintered body prepared in Preparation Example 1 was ground into a rectangular parallelepiped of 200 mm×70 mm with a thickness of 5 mm to obtain a target material. This target material was bonded to a backing plate made of copper by a metal bond and mounted on a magnetron DC sputtering apparatus. To each of a glass substrate of 5 cm×5 cm with a thickness of 1.1 mm and a silicon substrate having a diameter of 10 cm with a thickness of 0.525 mm, sputtering was carried out by adjusting the applied power to DC 0.75 kW, the back pressure to 1×10$^{-3}$ Pa, the sputtering pressure to 0.6 Pa and the proportion of oxygen gas to the total amount of oxygen gas and argon gas in the atmosphere as shown in Table 1, to carry out deposition of a Nb$_2$O$_5$ film having a film thickness as identified in Table 1. The electric discharge during the sputtering was very stable, and deposition was carried out under a stabilized condition even by DC sputtering.

After the deposition, the film thickness was measured by means of a feeler-type film thickness measuring apparatus.

The bow before the deposition, the bow after the deposition and the stress of the film were obtained by means of FleXus F2320 as FLX THIN FILMS STRESS MEASUREMENT SYSTEM by Tencor Instruments Company, whereby a silicon substrate was set so that its direction was constant, and the bow (radius of curvature) of the silicon substrate having a diameter of 10 cm was measured before and after the deposition. Here, the bow δ of the substrate was obtained by the method disclosed in FIG. 2.

In FIG. 2, the substrate S means an ideal substrate having a completely flat surface, and the substrate S' means a usual substrate. The bow δ of the substrate means the distance δ from the surface of the ideal substrate S to the largest concave or convex which the usual substrate S' has. The symbol of the bow is (+) when the deposition side is convex and is (−) when the film-formed side is concave. Further, the diameter of the substrate S used in the Example was 10 cm, but in consideration of the uniformity of the film thickness, the actual measurement was carried out with respect to the 8 cm portion excluding 1 cm each at both ends, the measurement was made in the same manner also with respect to other bows. Here, the stress of the film is calculated by the following formula.

$$\sigma = (1/R_2 - 1/R_1) E h^2 / \{6t(1-\nu)\}$$

Here σ: the stress of the film, $R_1$: the radius of curvature of the substrate before the deposition, $R_2$: the radius of curvature of the substrate after the deposition, E: the Young's modulus of the substrate S, h: the thickness of the substrate S, t: the film thickness, ν: the Poisson's ratio of the substrate S. Here, the curvature radii $R_1$ and $R_2$ mean R disclosed in FIG. 2, but they are calculated by the following formulae.

$$R_1 \approx r^2/2\delta_1, \quad R_2 \approx r^2/2\delta_2$$

Here, r: radius of the substrate S, and $\delta_1$ and $\delta_2$ are bows of the substrate before and after the deposition.

The refractive index of the film on the glass substrate was measured by spectral ellipsometer WVASE32 of J.A. Woollam Co., Inc. Here, the film was transparent, and no light absorption of the film was observed.

In Table 1, the film thickness, the deposition rate, the stress of the film, and the refractive index of the film at a wavelength of 550 nm are shown, and in Table 1-2, the bow before the deposition, the bow after the deposition, the absolute value of the difference in bow as between before and after the deposition, and the value obtained by dividing the difference in bow as between before and after the deposition by the film thickness, are shown.

Reference Examples 7 to 11

Sputtering was carried out in the same manner as in Reference Example 1 except that a commercially available Nb metal was used as a target material instead of the NbO$_X$ target material in Reference Example 1, and the proportion of oxygen gas to the total amount of oxygen gas and argon gas in the atmosphere, was adjusted as shown in Table 1, to carry out deposition of a Nb$_2$O$_5$ film. The electric discharge during sputtering was very stable, and the deposition was carried out under a stabilized condition even by DC sputtering. The characteristics of the Nb$_2$O$_5$ film were measured in the same manner as in Reference Example 1, and the results are shown in Table 1 and Table 1-2.

Reference Examples 12 to 14

The TiO$_X$ sintered body prepared in Preparation Example 2 was ground into a rectangular parallelepiped of 200 mm×70 mm with a thickness of 5 mm to obtain a target material. This target material was bonded to a backing plate made of copper, by a metal bond and mounted on a magnetron DC sputtering apparatus. To each of a glass substrate of 5 cm×5 cm with a thickness of 1.1 mm and a silicon substrate having a diameter of 10 cm with a thickness of 0.525 mm, sputtering was carried out by adjusting the applied power to DC 0.75 kW, the back pressure to 1×10$^{-3}$ Pa, the sputtering pressure to 0.6 Pa, and the proportion of oxygen gas to the total amount of oxygen gas and argon gas in the atmosphere as identified in Table 1, to carry out deposition of a TiO$_2$ film having a film thickness as identified in Table 1. The electric discharge during sputtering was very stable, and deposition was carried out under a stabilized condition even by DC sputtering. The characteristics of the TiO$_2$ film were measured in the same manner as in Reference Example 1, and the results are shown in Table 1 and Table 1-2.

Reference Examples 15 and 16

Sputtering was carried out in the same manner as in Reference Example 12 except that a commercially available Ti metal was used as a target material instead of the TiO$_X$ target material in Reference Example 12, and the proportion of oxygen gas to the total amount of oxygen gas and argon gas in the atmosphere, was adjusted as identified in Table 1, to carry out deposition of a TiO$_2$ film. The electric discharge during sputtering was very stable, and the deposition was carried out under a stabilized condition even by DC sputtering. The characteristics of the TiO$_2$ film were measured in the same manner as in Reference Example 1, and the results are shown in Table 1 and Table 1-2.

Reference Examples 17 and 18

Sputtering was carried out in the same manner as in Reference Example 1 except that a commercially available Si (B-doped) was used as a target material instead of the NbO$_X$ target material in Reference Example 1, and the proportion of oxygen gas to the total amount of oxygen gas and argon gas in the atmosphere was adjusted as identified in Table 1, to carry out deposition of a SiO$_2$ film. The characteristics of the SiO$_2$ film were measured in the same manner as in Reference Example 1, and the results are shown in Table 1 and Table 1-2.

TABLE 1

| Ex. No. | Target material | Oxygen content in the sputtering atmosphere (vol %) | Single layer film ||||
|---|---|---|---|---|---|---|
| | | | Film thickness (nm) | Deposition rate (nm · m/min) | Stress (Mpa) | Refractive index at wavelength of 550 nm |
| Ref. Ex. 1 | $NbO_x$ | 10 | 100 | 11.7 | −87.8 | 2.3 |
| Ref. Ex. 2 | $NbO_x$ | 10 | 200 | 11.7 | −50.7 | 2.3 |
| Ref. Ex. 3 | $NbO_x$ | 10 | 300 | 11.7 | −16.4 | 2.3 |
| Ref. Ex. 4 | $NbO_x$ | 10 | 470 | 11.7 | +4.1 | 2.3 |
| Ref. Ex. 5 | $NbO_x$ | 10 | 1050 | 11.7 | +22.1 | 2.3 |
| Ref. Ex. 6 | $NbO_x$ | 10 | 2200 | 11.7 | +21.8 | 2.3 |
| Ref. Ex. 7 | Nb | 30 | 100 | 4.5 | −182.6 | 2.3 |
| Ref. Ex. 8 | Nb | 30 | 200 | 4.5 | −160.4 | 2.3 |
| Ref. Ex. 9 | Nb | 30 | 490 | 4.5 | −123.6 | 2.3 |
| Ref. Ex. 10 | Nb | 30 | 940 | 4.5 | −97.6 | 2.3 |
| Ref. Ex. 11 | Nb | 100 | 1300 | 2.0 | −266.1 | 2.3 |
| Ref. Ex. 12 | $TiO_x$ | 10 | 60 | 3.3 | +36.3 | 2.4 |
| Ref. Ex. 13 | $TiO_x$ | 10 | 200 | 3.3 | +131.5 | 2.4 |
| Ref. Ex. 14 | $TiO_x$ | 10 | 940 | 3.3 | +141.1 | 2.4 |
| Ref. Ex. 15 | Ti | 40 | 200 | 1.1 | −221.2 | 2.4 |
| Ref. Ex. 16 | Ti | 100 | 260 | 1.1 | −321.7 | 2.4 |
| Ref. Ex. 17 | Si | 50 | 240 | 7.1 | −116.1 | 1.46 |
| Ref. Ex. 18 | Si | 50 | 1200 | 7.1 | −109.2 | 1.46 |

In the Table, the stress is a tensile stress when it is on the (+) side, and it is a compressive stress when it is on the (−) side.

TABLE 1-2

| Ex. No. | Bow before deposition (μm) | Bow after deposition (μm) | Absolute value of the difference in bow as between before and after deposition (μm) | Absolute value/film thickness of the difference in bow as between before and after deposition |
|---|---|---|---|---|
| Ref. Ex. 1 | −6.88 | −6.05 | 0.83 | 8.30 |
| Ref. Ex. 2 | −9.78 | −8.80 | 0.98 | 4.90 |
| Ref. Ex. 3 | −6.23 | −5.79 | 0.44 | 1.47 |
| Ref. Ex. 4 | 14.83 | 14.64 | 0.19 | 0.40 |
| Ref. Ex. 5 | 12.80 | 10.68 | 2.12 | 2.02 |
| Ref. Ex. 6 | −8.08 | −12.75 | 4.67 | 2.12 |
| Ref. Ex. 7 | 2.81 | 4.57 | 1.76 | 17.60 |
| Ref. Ex. 8 | 3.39 | 6.37 | 2.98 | 14.90 |
| Ref. Ex. 9 | −2.66 | 4.02 | 6.68 | 13.63 |
| Ref. Ex. 10 | 6.51 | 15.41 | 8.90 | 9.47 |
| Ref. Ex. 11 | 5.71 | 39.13 | 33.42 | 25.71 |
| Ref. Ex. 12 | −2.86 | −3.08 | 0.22 | 3.67 |
| Ref. Ex. 13 | 4.59 | 2.06 | 2.53 | 12.65 |
| Ref. Ex. 14 | 2.97 | −10.25 | 13.22 | 14.06 |
| Ref. Ex. 15 | 6.60 | 9.89 | 3.29 | 16.45 |
| Ref. Ex. 16 | 8.95 | 15.67 | 6.72 | 25.85 |
| Ref. Ex. 17 | 3.65 | 6.25 | 2.60 | 10.83 |
| Ref. Ex. 18 | 13.85 | 25.24 | 11.39 | 9.49 |

From Table 1 and Table 1-2, it is evident that in a case where $NbO_x$ deficient in oxygen is used as a target material in DC sputtering, it is possible to deposit a $Nb_2O_5$ film having the stress relaxed (having a low stress) and having less bow as compared with a case where Nb metal is used as a target material. This is also evident from FIG. 1 wherein the stress to the change in the film thickness is compared as between $Nb_2O_5$ single layer film when $NbO_x$ was used as a target material and a $Nb_2O_5$ single layer film when Nb metal was used as a target material. Here, in FIG. 1, when the stress is on the (+) side, it is a tensile stress, and when it is on the (−) side, it is a compressive stress. Further, from Table 1, it is evident that in a case where $NbO_X$ deficient in oxygen was used as a target material, the deposition rate was a high speed as compared with a case where Nb metal was used as a target material.

Further, it is evident that in a case where $TiO_X$ was used as a target material, it is possible to deposit a $TiO_2$ film having the stress relaxed at a high speed as compared with a case where Ti metal was used as a target material.

(2) Formation of a Multilayer Film (DC Sputtering Method)

Example 1

The $NbO_X$ target material used in Reference Example 1, was mounted on a magnetron DC sputtering apparatus in the same manner as in Reference Example 1. To each of a glass substrate of 5 cm×5 cm with a thickness of 1.1 mm and a silicon substrate having a diameter of 10 cm with a thickness of 0.525 mm, sputtering was carried out by adjusting the applied power to DC 0.75 kW, the back pressure to $1×10^{-3}$ Pa, the sputtering pressure to 0.6 Pa, and the proportion of oxygen gas to the total amount of oxygen gas and argon gas in the atmosphere as identified in Table 2, to carry out deposition of a $Nb_2O_5$ film having a thickness of 200 nm.

Then, using the same magnetron DC sputtering apparatus and a commercially available Si (B-doped) as a target material, sputtering was carried out under the same conditions as the sputtering conditions of the $NbO_X$ target material except that the proportion of oxygen gas to the total amount of oxygen gas and argon gas in the atmosphere was adjusted as identified in Table 2, to deposit a $SiO_2$ film having a thickness of 240 nm on the $Nb_2O_5$ film on the substrate, to obtain a multilayer film (2 layers)-coated substrate. The characteristics of the multilayer film were measured in the same manner as in Reference Example 1, and the results are shown in Table 2 and Table 2-2.

Examples 2 and 3

Sputtering was carried out in the same manner as in Example 1 except that in Example 1, sputtering for depositing the $Nb_2O_5$ film and the $SiO_2$ film was repeated five times or ten times to laminate the $Nb_2O_5$ film and the $SiO_2$ film, to obtain a multilayer film (10 layers or 20 layers)-coated substrate. The characteristics of the multilayer film were measured in the same manner as in Reference Example 1, and the results are shown in Table 2 and Table 2-2.

Example 4

The $TiO_X$ target material used in Reference Example 12, was mounted on a magnetron DC sputtering apparatus in the same manner as in Example 1. To each of a glass substrate of 5 cm×5 cm with a thickness of 1.1 mm and a silicon substrate having a diameter of 10 cm with a thickness of 0.525 mm, sputtering was carried out by adjusting the applied power to DC 0.75 kW, the back pressure to $1×10^{-3}$ Pa, the sputtering pressure to 0.6 Pa and the proportion of oxygen gas to the total amount of oxygen gas and argon gas in the atmosphere as identified in Table 2, to carry out deposition of a $TiO_2$ film having a thickness of 200 nm.

Then, using the same magnetron DC sputtering apparatus and a commercially available Si (B-doped) as a target material, sputtering was carried out under the same conditions as the sputtering conditions of the $TiO_X$ target material except that the proportion of oxygen gas to the total amount of oxygen gas and argon gas in the atmosphere was adjusted as shown in Table 2, to deposit a $SiO_2$ film having a thickness of 240 nm on the $TiO_2$ film on the substrate, to obtain a multilayer film (2 layers)-coated substrate. The characteristics of the multilayer film were measured in the same manner as in Reference Example 1, and the results are shown in Table 2 and Table 2-2.

Example 5

Sputtering was carried out in the same manner as in Example 4 except that in Example 4, sputtering to deposit the $TiO_2$ film and the $SiO_2$ film was repeated five times, to obtain a multilayer film (10 layers)-coated substrate. The characteristics of the multilayer film were measured in the same manner as in Reference Example 1, and the results are shown in Table 2 and Table 2-2.

Comparative Example 1

Sputtering was carried out in the same manner as in Example 1 except that a commercially available Nb metal was used as a target material instead of the $NbO_X$ target material in Example 1, and the proportion of oxygen gas to the total amount of oxygen gas and argon gas in the atmosphere was adjusted as shown in Table 2, to carry out deposition of a $Nb_2O_5$ film having a thickness of 200 nm.

Then, using the same magnetron DC sputtering apparatus and a commercially available Si (B-doped) as a target material, sputtering was carried out under the same conditions as the sputtering conditions of the Nb metal target material except that the proportion of oxygen gas to the total amount of oxygen gas and argon gas in the atmosphere was adjusted as shown in Table 2, to deposit a $SiO_2$ film having a thickness of 240 nm on the $Nb_2O_5$ film on the substrate, to obtain a multilayer film (2 layers)-coated substrate. The characteristics of the multilayer film were measured in the same manner as in Reference Example 1, and the results are shown in Table 2 and Table 2-2.

Comparative Example 2

Sputtering was carried out in the same manner as in Comparative Example 1 except that in Comparative Example 1, sputtering to deposit the $Nb_2O_5$ film and the $SiO_2$ film was repeated five times for lamination to obtain a multilayer film (10 layers)-coated substrate. The characteristics of the multilayer film were measured in the same manner as in Reference Example 1, and the results are shown in Table 2 and Table 2-2.

Comparative Example 3

Sputtering was carried out in the same manner as in Example 4 except that a commercially available Ti metal was used as a target material instead of the $TiO_X$ target material in Example 4, and the proportion of oxygen gas to the total amount of oxygen gas and argon gas in the atmosphere was adjusted as identified in Table 2, to carry out deposition of a $TiO_2$ film having a thickness of 200 nm.

Then, using the same magnetron DC sputtering apparatus and a commercially available Si (B-doped) as a target material, sputtering was carried out under the same conditions as the sputtering conditions of the Ti metal target material except that the proportion of oxygen gas to the total amount of oxygen gas and argon gas in the atmosphere was adjusted as identified in Table 2, to deposit a SiO$_2$ film having a thickness of 240 nm on the TiO$_2$ film on the substrate, to obtain a multilayer film (2 layers)-coated substrate. The characteristics of the multilayer film were measured in the same manner as in Reference Example 1, and the results are shown in Table 2 and Table 2-2.

Comparative Example 4

Sputtering was carried out in the same manner as in Comparative Example 3 except that in Comparative Example 3, sputtering to deposit the TiO$_2$ film and the SiO$_2$ film was repeated five times for lamination to obtain a multilayer film (10 layers)-coated substrate. The characteristics of the multilayer film were measured in the same manner as in Reference Example 1, and the results are shown in Table 2 and Table 2-2.

TABLE 2

| Ex. No. | Target material | Oxygen content in the sputtering atmosphere (vol %) Metal oxide film | Silicon dioxide film | Construction of the multilayer film-coated substrate | Multilayer film Thickness (nm) | Stress (Mpa) |
|---|---|---|---|---|---|---|
| Ex. 1 | NbO$_x$/Si | 10 | 50 | Substrate/Nb$_2$O$_5$/SiO$_2$ | 440 | −70.1 |
| Ex. 2 | NbO$_x$/Si | 10 | 50 | Substrate/(Nb$_2$O$_5$/SiO$_2$) × 5 | 2200 | −51.5 |
| Ex. 3 | NbO$_x$/Si | 10 | 50 | Substrate/(Nb$_2$O$_5$/SiO$_2$) × 10 | 4400 | −53.6 |
| Comp. Ex. 1 | Nb/Si | 30 | 50 | Substrate/Nb$_2$O$_5$/SiO$_2$ | 440 | −163.7 |
| Comp. Ex. 2 | Nb/Si | 30 | 50 | Substrate/(Nb$_2$O$_5$/SiO$_2$) × 5 | 2200 | −127.1 |
| Ex. 4 | TiO$_x$/Si | 10 | 50 | Substrate/TiO$_2$/SiO$_2$ | 440 | +2.1 |
| Ex. 5 | TiO$_x$/Si | 10 | 50 | Substrate/(TiO$_2$/SiO$_2$) × 5 | 2200 | +8.2 |
| Comp. Ex. 3 | Ti/Si | 40 | 50 | Substrate/TiO$_2$/SiO$_2$ | 440 | −166.0 |
| Comp. Ex. 4 | Ti/Si | 40 | 50 | Substrate/(TiO$_2$/SiO$_2$) × 5 | 2200 | −116.0 |

In the Table, the stress is a tensile stress when it is on the (+) side, and it is a compressive stress when it is on the (−) side.

TABLE 2-2

| Ex. No. | Bow before deposition (μm) | Bow after deposition (μm) | Absolute value of the difference in bow as between before and after deposition (μm) | Absolute value/film thickness of the difference in bow as between before and after deposition |
|---|---|---|---|---|
| Ex. 1 | −4.31 | −1.86 | 2.45 | 5.57 |
| Ex. 2 | 7.18 | 16.98 | 9.80 | 4.45 |
| Ex. 3 | −7.66 | 13.94 | 21.60 | 4.91 |
| Comp. Ex. 1 | −8.60 | −2.60 | 6.00 | 13.64 |
| Comp. Ex. 2 | −1.71 | 23.01 | 24.72 | 11.24 |
| Ex. 4 | 7.51 | 7.49 | 0.02 | 0.05 |
| Ex. 5 | −3.16 | −4.37 | 1.21 | 0.55 |
| Comp. Ex. 3 | −6.85 | 2.58 | 9.43 | 21.43 |
| Comp. Ex. 4 | −7.30 | 16.36 | 23.66 | 10.75 |

From Table 2 and Table 2-2, it is evident that in a case where NbO$_X$ deficient in oxygen is used in DC sputtering, it is possible to deposit a multilayer film comprising a Nb$_2$O$_5$ film and a SiO$_2$ film, having the stress relaxed (having a low stress) and having less bow as compared with a case where Nb metal is used as a target material.

Further, it is evident that in a case where a TiO$_X$ target material is used, it is possible to deposit a multilayer film comprising a TiO$_2$ film and a SiO$_2$ film, having the stress relaxed, as compared with a case where Ti metal is used as a target material.

(3) Formation of a Multilayer Film (Examples Wherein the Thickness of the Silicon Substrate is Thin)

Example 6

Sputtering is carried out in the same manner as in Example 5 except that the thickness of the silicon substrate is changed from 0.525 mm to 0.2 mm, to obtain a multilayer film (10 layers)-coated substrate. The absolute value of the difference in bow as between before and after the deposition is 8.34 μm.

Comparative Example 5

Sputtering is carried out in the same manner as in Comparative Example 4 except that the thickness of the silicon substrate is changed from 0.525 mm to 0.2 mm, to obtain a multilayer film (10 layers)-coated substrate. The absolute value of the difference in bow as between before and after deposition at that time is 163.03 μm.

(4) Formation of a Multilayer Film (Examples of an AC Sputtering Method)

Example 7

The NbO$_X$ target material used in Reference Example 1 is mounted on a magnetron AC sputtering apparatus in the same manner as in Reference Example 1. To each of a glass substrate of 5 cm×5 cm with a thickness of 1.1 mm and a silicon substrate having a diameter of 10 cm with a thickness of 0.525 mm, sputtering is carried out by adjusting the applied power to AC 0.7 kW, the back pressure to 1×10$^{-3}$ Pa, the sputtering pressure to 0.6 Pa, and the proportion of oxygen gas to the total amount of oxygen gas and argon gas in the atmosphere as identified in Table 3, to carry out deposition of a Nb$_2$O$_5$ film having a thickness of 200 nm.

Then, using the same magnetron AC sputtering apparatus and a commercially available Si (B-doped) as a target material, sputtering is carried out under the same conditions as the sputtering conditions of the NbO$_X$ target material except that the proportion of oxygen gas to the total amount of oxygen gas and argon gas in the atmosphere is adjusted as identified in Table 3, to carry out deposition of a SiO$_2$ film having a thickness of 240 nm on the Nb$_2$O$_5$ film on the substrate.

Further, sputtering to deposit a Nb$_2$O$_5$ film and a SiO$_2$ film is repeated four times for lamination to obtain a multilayer film (10 layers)-coated substrate. The characteristics of the multilayer film are measured in the same manner as in Reference Example 1, and the results are shown in Table 3-1 and Table 3-2.

TABLE 3-1

| Ex. No. | Target material | Oxygen content in the sputtering atmosphere (vol %) | | Construction of the multilayer film-coated substrate | Multilayer film | |
|---|---|---|---|---|---|---|
| | | Metal oxide film | Silicon oxide film | | Thickness (nm) | Stress (Mpa) |
| Ex. 7 | NbO$_x$/Si | 10 | 50 | Substrate/ (Nb$_2$O$_5$/ SiO$_2$) × 5 | 2200 | −68.7 |

In the Table, the stress is a tensile stress when it is on the (+) side, and it is a compressive stress when it is on the (−) side.

TABLE 3-2

| Ex. No. | Bow before deposition (μm) | Bow after deposition (μm) | Absolute value of the difference in bow as between before and after deposition (μm) | Absolute value/film thickness of the difference in bow as between before and after deposition |
|---|---|---|---|---|
| Ex. 7 | 2.14 | 15.83 | 13.69 | 6.22 |

INDUSTRIAL APPLICABILITY

The target material to be used in the present invention has an electrical conductivity, whereby a sputtering method, particularly a DC or AC sputtering method, can be employed. Accordingly, the productivity is good, and in addition, it is possible to deposit a multilayer film comprising a transparent metal oxide film and a silicon oxide film, having the stress relaxed and having a large area, which used to be hardly obtainable by a conventional sputtering method. Accordingly, the multilayer film of the transparent metal oxide film having the stress relaxed, of the present invention, has little bow in spite of the large thickness, whereby polishing after the deposition is unnecessary, and it can suitably be used for an anti-reflection film, a reflection-increasing film, an interference filter, a polarizing film or the like.

The entire disclosure of Japanese Patent Application No. 2002-306705 filed on Oct. 22, 2002 including specification, claims, drawings and summary is incorporated herein by reference in its entirety.

What is claimed is:

1. A multilayer film-coated substrate comprising:
a substrate; and
a multilayer film laminated on the substrate and comprising a plurality of metal oxide films and a plurality of silicon oxide films, the silicon oxide films and the metal oxide films being alternately laminated and forming at least twenty layers,
wherein said plurality of metal oxide films includes at least one metal oxide film layer deposited by sputtering with a target material comprising a metal oxide MO$_X$ (where a metal M is at least one metal selected from the group consisting of Ti, Nb, Ta, Mo, W, Zr and Hf, said metal oxide MO$_X$ has a stoichiometric composition which is deficient in oxygen, said sputtering is carried out under conditions in which oxygen deficiency is resolved, the multilayer film has a stress of from −100 MPa to +100 MPa, the substrate has a thickness of from 0.05 to 0.4 mm, and the substrate after depositing the multilayer film structure has a bow of from −20 to +20 μm.

2. The multilayer film-coated substrate according to claim 1, wherein when said metal M in the metal oxide MO$_X$ is Nb and/or Ta, X is 2<X<2.5.

3. The multilayer film-coated substrate according to claim 1, wherein when said metal M in the metal oxide MO$_X$ is at least one metal selected from the group consisting of Ti, Zr and Hf, X is 1<X<2.

4. The multilayer film-coated substrate according to claim 1, wherein when said metal M in the metal oxide MO$_X$ is Mo and/or W, X is 2<X<3.

5. The multilayer film-coated substrate according to claim 1, wherein the stress of the multilayer film is from −60 MPa to +60 MPa.

6. The multilayer film-coated substrate according to claim 1, wherein the multilayer film is formed over an area of from 0.01 to 900 cm$^2$.

7. The multilayer film-coated substrate according to claim 6, wherein the film is formed over an area of from 1 to 900 cm$^2$.

8. The multilayer film-coated substrate according to claim 1, wherein each of the metal oxide films has a thickness of from 10 nm to 10 μm, and each of the silicon oxide film has a thickness of from 10 nm to 10 μm.

9. The multilayer film-coated substrate according to claim 1, wherein the multilayer film has a total thickness of from 20 nm to 2000 μm.

10. The multilayer film-coated substrate according to claim 1, wherein the multilayer film has a total thickness of from 20 to 5000 nm, and after depositing the film, a bow of the substrate differs from the bow of the substrate before depositing the multi-layer film by an absolute value of at most 25 μm.

11. The multilayer film-coated substrate according to claim 1, wherein after depositing the film, a bow of the substrate differs from the bow of the substrate before depositing the multi-layer film by an absolute value, which absolute value, when divided by the film thickness, is at most 10.

12. The multilayer film-coated substrate according to claim 1, wherein the multilayer-coated substrate is a dichroic mirror, an ultraviolet filter, an infrared filter, a band pass filter or a gain-flattening filter.

13. The multilayer film-coated substrate according to claim 1, further comprising an interlayer film incorporated between one of the metal oxide films and one of the silicon oxide films, wherein the interlayer film comprises a material different from the metal oxide films and silicon oxide films.

14. A multilayer film-coated substrate comprising:
a substrate; and
a multilayer film laminated on the substrate and comprising a plurality of metal oxide films and a plurality of silicon oxide films, the silicon oxide films and the metal oxide films being alternately laminated and forming at least twenty layers, wherein said plurality of metal oxide films includes at least one metal oxide film layer deposited by sputtering with a target material comprising a metal oxide $MO_X$ where a metal M is at least one metal selected from the group consisting of Ti, Nb, Ta, Mo, W, Zr and Hf, said metal oxide $MO_X$ has a stoichiometric composition which is deficient in oxygen, said sputtering is carried out under conditions in which oxygen deficiency is resolved, the multilayer film has a stress of from −100 MPa to +100 MPa, the substrate has a thickness of from 0.5 to 2 mm, and the substrate after depositing the multilayer film has a bow of from −100 to +100μm.

15. The multilayer film-coated substrate according to claim 14, wherein when said metal M in the metal oxide $MO_X$ is Nb and/or Ta, X is 2<X<2.5.

16. The multilayer film-coated substrate according to claim 14, wherein when said metal M in the metal oxide $MO_X$ is at least one metal selected from the group consisting of Ti, Zr and Hf, X is 1<X<2.

17. The multilayer film-coated substrate according to claim 14, wherein when said metal M in the metal oxide $MO_X$ is Mo and/or W, X is 2<X<3.

18. The multilayer film-coated substrate according to claim 14, wherein the stress of the multilayer film is from −60 MPa to +60 MPa.

19. The multilayer film-coated substrate according to claim 14, wherein the multilayer film is formed over an area of from 0.01 to 900 $cm_2$.

20. The multilayer film-coated substrate according to claim 19, wherein the film is formed over an area of from 1 to 900 $cm_2$.

21. The multilayer film-coated substrate according to claim 14, wherein each of the metal oxide films has a thickness of from 10 nm to 10 μm, and each of the silicon oxide film has a thickness of from 10 nm to 10 μm.

22. The multilayer film-coated substrate according to claim 14, wherein the multilayer film has a total thickness of from 20 nm to 2000 μm.

23. The multilayer film-coated substrate according to claim 14, wherein the multilayer film has a total thickness of from 20 to 5000 nm, and after depositing the film, a bow of the substrate differs from the bow of the substrate before depositing the multi-layer film by an absolute value of at most 25 μm.

24. The multilayer film-coated substrate according to claim 14, wherein after depositing the film, a bow of the substrate differs from the bow of the substrate before depositing the multi-layer film by an absolute value, which absolute value, when divided by the film thickness, is at most 10.

25. The multilayer film-coated substrate according to claim 14, wherein the multilayer-coated substrate is a dichroic mirror, an ultraviolet filter, an infrared filter, a band pass filter or a gain-flattening filter.

26. The multilayer film-coated substrate according to claim 14, further comprising at least one interlayer film incorporated between one of the metal oxide films and one of the silicon oxide films, wherein the interlayer film comprises a material different from the metal oxide films and silicon oxide films.

* * * * *